United States Patent [19]

Larson

[11] Patent Number: 5,028,890
[45] Date of Patent: Jul. 2, 1991

[54] VOLTAGE DRIVEN MICROWAVE AMPLITUDE MODULATION SYSTEM

[75] Inventor: Ronald K. Larson, Los Altos Hills, Calif.

[73] Assignee: Hewlett-Packard Company, Palo Alto, Calif.

[21] Appl. No.: 517,771

[22] Filed: May 2, 1990

[51] Int. Cl.⁵ .......................... H03C 1/06; H03C 1/14
[52] U.S. Cl. .................... 332/160; 332/174; 332/177; 332/178; 455/108
[58] Field of Search ............... 332/160, 164, 174, 177, 332/178; 455/63, 108; 307/264, 317.1; 333/81 R, 81 A, 81 B

[56] References Cited

U.S. PATENT DOCUMENTS 3,970,968  7/1976  Sly ................................. 332/177 X
4,646,036  2/1987  Brown ........................... 307/264 X Primary Examiner—Siegfried H. Grimm

[57] ABSTRACT

A microwave amplitude modulation system maintains constant amplitude attenuation at very high modulation rates over a broad range of microwave frequencies in response to voltage driving signals derived from modulation signals. In the system, the video input of a shunt-type PIN diode microwave amplitude modulation system is driven by a logarithmic voltage amplifier circuit which receives the modulation signals as an input.

15 Claims, 4 Drawing Sheets

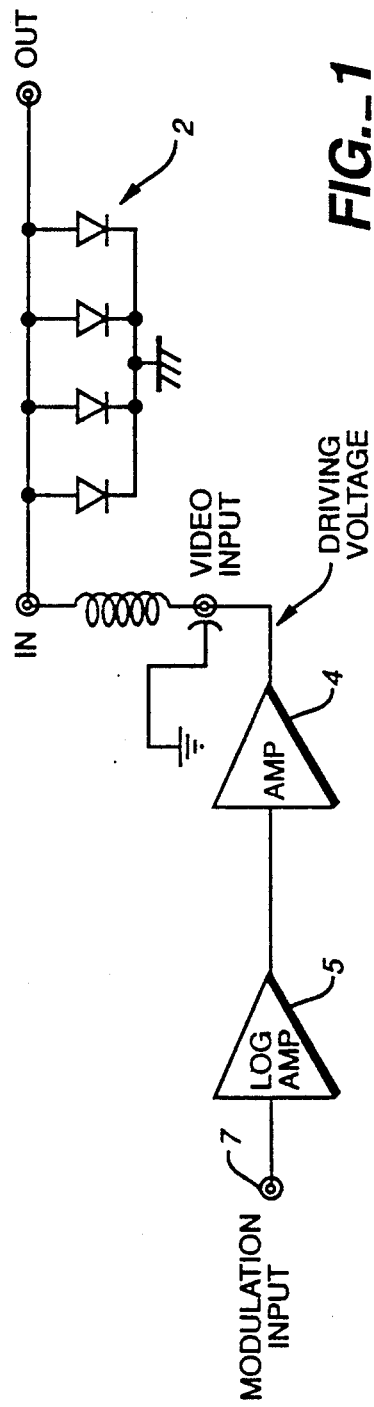
FIG._1
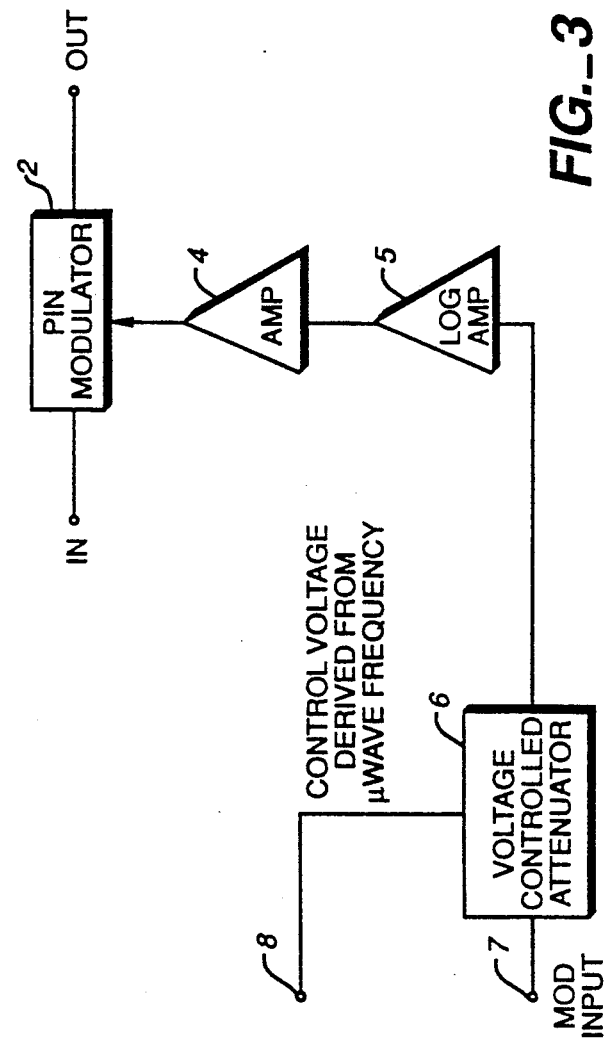
FIG._3

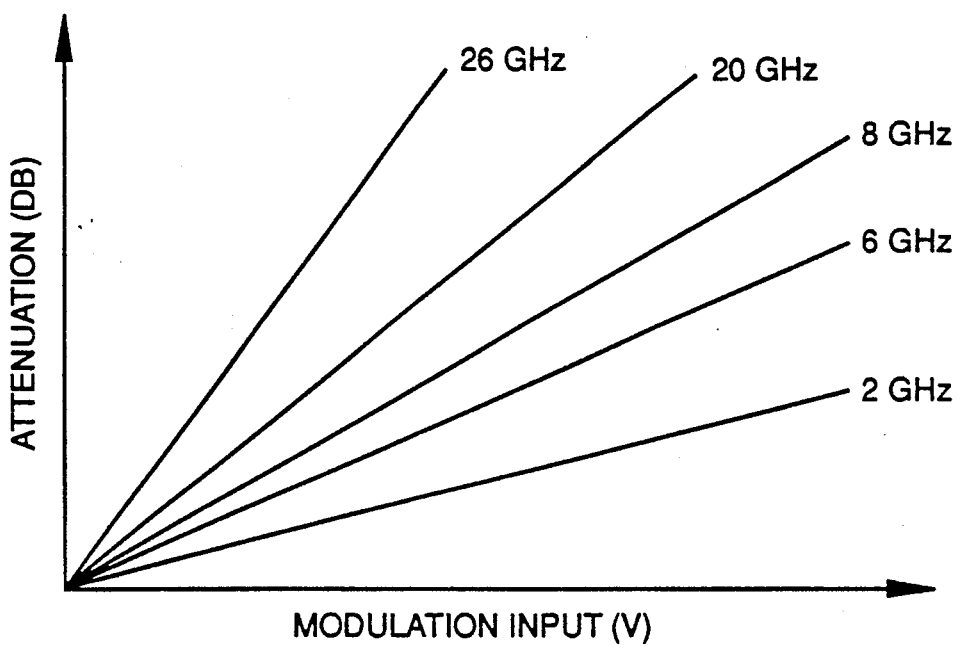
FIG._2

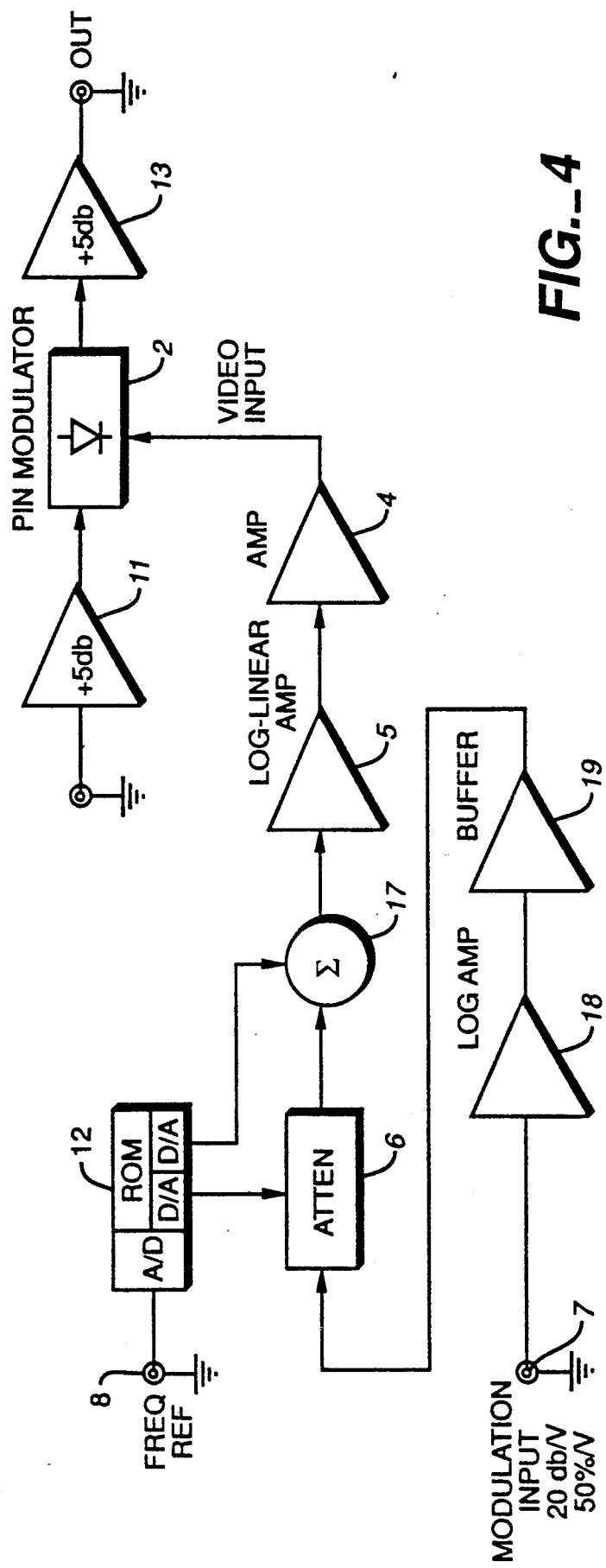
FIG._4

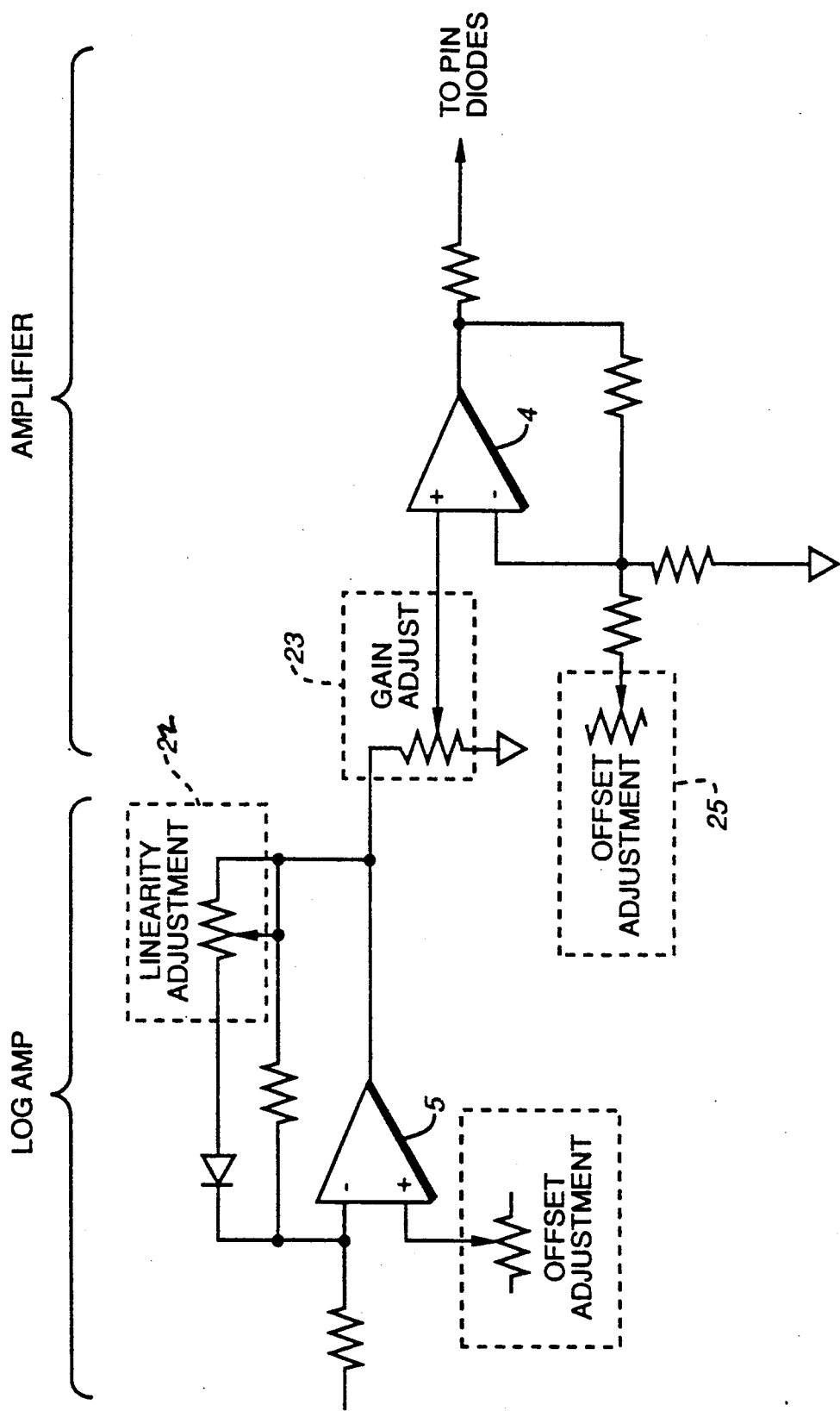
FIG._5

5,028,890

VOLTAGE DRIVEN MICROWAVE AMPLITUDE MODULATION SYSTEM

BACKGROUND OF THE INVENTION

1. Field of the Invention

The present invention generally relates to microwave amplitude modulation systems and, more particularly, to PIN diode modulation systems for modulating the amplitude of microwaves.

2. State of the Art

It is well-known to employ PIN diode modulators for modulating the amplitude of microwave signals. One of the advantages of PIN diodes in such applications is that those devices, when forward-biased, provide resistance that varies inversely with diode current and, accordingly, provide a voltage-current relationship which is exponential. Another advantage of PIN diodes in microwave modulating applications is that the diodes have generally monotonic frequency response characteristics in the frequency range of microwaves.

For modulating microwaves, one widely used type of PIN diode modulator is the so-called "shunt" type. Typically, shunt-type PIN diode modulators comprise four PIN diodes connected in parallel between a microwave conductor and ground. The video inputs to such shunt-type PIN modulators usually are driven by current sources. Such current drive sources, although providing generally favorable operating characteristics, limit the modulating frequency (as indicated by the modulator's half-power frequency) to the range of about 200 to 500 kilohertz. That modulating range is too narrow for a number of applications in modern, high-speed telecommunications and radar.

SUMMARY OF THE INVENTION

Generally speaking, the present invention provides a microwave amplitude modulation system that maintains constant amplitude attenuation at very high modulation rates over a broad range of microwave frequencies in response to driving signals. In the preferred embodiment of the present invention, a shunt-type PIN diode microwave amplitude modulation system is driven by a voltage amplifier connected to the video input of a PIN diode microwave modulator.

BRIEF DESCRIPTION OF THE DRAWINGS

The present invention can be further understood by reference to the following description and attached drawings which illustrate the preferred embodiment of the invention. For purposes of clarity, identical parts are given the same reference numbers in the various drawing figures. In the drawings:

FIG. 1 is a functional block diagram of the basic elements of a system according to the present invention;

FIG. 2 is a graph showing attenuation characteristic of the system of FIG. 1;

FIG. 3 is a functional block diagram of a more detailed embodiment of a system according to the present invention;

FIG. 4 is a functional block diagram of one particular embodiment of a system according to the present invention; and FIG. 5 is a schematic diagram of circuitry for use in the systems of FIGS. 1, 3, and 4.

DETAILED DESCRIPTION OF THE PREFERRED EMBODIMENT

FIG. 1 generally shows a microwave amplitude modulation system that maintains constant amplitude attenuation at very high modulation rates over a broad range of microwave frequencies in response to voltage driving signals.

In the system of FIG. 1, a PIN modulator 2 is connected to modulate a microwave-frequency input signal. The PIN modulator can, for example, comprise a conventional shunt-type PIN diode modulator as shown and as described above. In the illustrated embodiment, however, the video input terminal of modulator 2 is driven by a voltage amplifier 4 which, in turn, is driven by a logarithmic voltage amplifier 5. The modulating voltage input is provided to logarithmic voltage amplifier 5.

Preferably, voltage amplifier 4 in the system of FIG. 1 has a very low source impedance. The low source impedance primarily determines the half-power modulation frequency. In practice, the low source impedance allows for modulation rates of more than 10 MHz. The logarithmic voltage amplifier 5 allows the attenuation characteristics to be linear, in terms of decibels per volt, across the dynamic range of the modulation system.

FIG. 2 shows operating characteristics of the microwave modulation system of FIG. 1. More particularly, FIG. 2 indicates the manner in which the sensitivity (in volts per decibel) of the modulating signal varies with microwave frequency.

FIG. 3 is a functional block diagram of a more detailed embodiment of the system of FIG. 1. In the illustrated embodiment, the input to logarithmic amplifier 5 is provided by a linear, voltage-controlled attenuator 6 that receives modulating input signals on a line 7. The control voltage signals to attenuator 6 are provided on a line 8 from a microwave signal generator. In practice, various conventional microwave signal generators can be used for providing control voltage signals that are linear in volts per GHz.

As shown in FIG. 4, auxiliary elements can be added to the above-described microwave amplitude modulation system. In the illustrated embodiment, microwave buffer amplifiers 11 and 13 are connected, respectively, both before and after PIN modulator 2 in the microwave signal path. In practice, such amplifiers provide good input-output matches over the normal operating range (e.g., 2-20 gigahertz) of the microwave amplitude modulation system. The microwave buffer amplifiers 11 and 13 are preferably microwave integrated circuits (MICs) constructed of gallium arsenide, with each providing a gain of about five decibels.

FIG. 4 further shows a functional block 12 which is interposed between voltage-controlled attenuator 6 and the frequency reference input from the microwave signal generator connected to line 8. The purpose of functional block 12 is to compensate for variations in sensitivity and insertion losses. In the illustrated embodiment, functional block 12 includes an analog-to-digital converter, a correction factor read-only memory (ROM) and a pair of digital-to-analog converters (DACs). The output of one of the DACs is employed to adjust the input to voltage-controlled attenuator 6 in response to variations in sensitivity with frequency. The output of the other one of the DACs is employed to provide a correction factor that is summed with the attenuator output at a summing junction 17 to correct for small variations in sensitivity and insertion loss with frequency in the microwave signal path.

Finally with regard to FIG. 4, an additional logarithmic amplifier 18 and buffer 19 are arranged to be switched into the modulation input path. The purpose of the additional logarithmic amplifier 18 and buffer 19 is to provide a percent/volt mode as an alternative to the decibel/volt mode.

FIG. 5 shows the preferred embodiment of circuitry for implementing the above-discussed voltage amplifier 4 and logarithmic voltage amplifier 5. One benefit of the illustrated embodiment is that exceptional linearity in volts per db over the dynamic range of 80 db is provided as a result of the linearity adjustment circuit 22 on logarithmic voltage amplifier 5, and the gain and offset adjustment circuits 23 and 25, respectively, on voltage amplifier 4. More particularly, the linearity adjustment circuit 22 allows amplifier 5 to operate as a logarithmic amplifier at low signal levels and as a linear amplifier at high signal levels. The gain and offset adjustment circuits 23 and 25 allow voltage amplifier 4 to exactly match the current versus voltage curve of the PIN diode modulator.

At this juncture, it can be appreciated that the above-described system provides a low-cost microwave amplitude modulation system that operates at very high modulation rates (i.e., several megahertz) while maintaining linearity, in terms of decibels per volt or percent per volt, over a wide microwave frequency range and a wide dynamic range.

It will be appreciated by those of ordinary skill in the art that the present invention can be embodied in other specific forms without departing from the spirit or essential character thereof. The presently disclosed embodiments are therefore considered in all respects to be illustrative and not restrictive. The scope of the invention is indicated by the appended claims rather than the foregoing description, and all changes which come within the meaning and range of equivalence thereof are intended to be embraced therein.

What is claimed is:

1. A microwave amplitude modulation system, comprising:
    at least one PIN diode connected in shunt between a microwave signal path and a reference voltage; and
    logarithmic voltage drive means for driving the PIN diode with a modulation voltage, the cascade combination of said logarithmic voltage drive means and said PIN diode exhibiting a linear attenuation characteristic.

2. The system of claim 1 wherein the voltage drive means includes a voltage amplifier driven by a logarithmic voltage amplifier.

3. The system of claim 2 further including a linear attenuator connected to provide input signals to the logarithmic voltage amplifier and having a control voltage input, said linear attenuator causing said modulation system to exhibit a linear attenuation characteristic across a range of frequencies, with said control voltage input being proportion to frequency of a microwave signal applied to said microwave signal path.

4. The system of claim 3 further including a correction factor ROM responsive to a digital representation of said control voltage input to correct said input signal to said logarithmic voltage drive means for variations in sensitivity and insertion loss.

5. The system of claim 2 further including one or more additional PIN diodes connected in parallel with said PIN diode.

6. The system of claim 4 wherein a portion of an output of said correction factor ROM is converted to an analog voltage to control said linear attenuator and wherein another portion of an output of said correction factor ROM is converted to an analog voltage and summed with an output of said linear attenuator.

7. A method of amplitude modulation of a radio-frequency signal comprising the steps of:
    shunting a variable portion of said radio-frequency signal to ground through a PIN diode; and
    driving said PIN diode with a modulation voltage applied through an amplifier of low output impedance, whereby an upper modulation rate is primarily determined by said output impedance and is substantially independent of mean carrier lifetime of the PIN diode.

8. The method of claim 7 wherein the driving step comprises driving said amplifier using a gain element that exhibits a substantially inverse attenuation characteristic as said PIN diode.

9. The method of claim 8 wherein said driving step further comprises scaling an input of said gain element.

10. The method of claim 8 further including the step of correcting an input to said gain element for non-linearity in said modulation.

11. An amplitude modulation system comprising a PIN diode connected in shunt between a signal path and a reference voltage and a low output impedance voltage driver for driving the PIN diode with a modulation voltage drive signal to cause it to attenuate a signal appearing on said signal path according to the magnitude of said modulation voltage drive signal.

12. The system of claim 11 further including linearizing means for providing an input signal to said voltage driver, the cascade combination of said linearizing means, said voltage driver and said PIN diode exhibiting a linear attenuation characteristic.

13. The system of claim 12 wherein said linearizing means includes a logarithmic amplifier and a voltage amplifier, the latter having gain and offset adjustments that match the logarithmic amplifier to the PIN diode.

14. The system of claim 13 wherein said linearizing means further includes a linear attenuator in series combination with said logarithmic amplifier.

15. The system of claim 14 wherein the linearizing means further includes a correction factor ROM for correcting a modulation input signal to said logarithmic amplifier for non-linearity.

* * * * *